United States Patent
Yoshimatsu et al.

(10) Patent No.: US 6,940,164 B1
(45) Date of Patent: Sep. 6, 2005

(54) POWER MODULE

(75) Inventors: Naoki Yoshimatsu, Fukuoka (JP); Dai Nakajima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 107 days.

(21) Appl. No.: 10/110,344

(22) PCT Filed: Aug. 18, 2000

(86) PCT No.: PCT/JP00/05536

§ 371 (c)(1),
(2), (4) Date: Apr. 11, 2002

(87) PCT Pub. No.: WO02/17400

PCT Pub. Date: Feb. 28, 2002

(51) Int. Cl.[7] .................. H01L 23/34; H01L 23/02; H01L 29/00
(52) U.S. Cl. ................. 257/725; 257/728; 257/723; 257/713; 257/712; 257/685; 257/532
(58) Field of Search ................. 257/713, 712, 257/728, 725, 723, 685, 532, 528

(56) References Cited

U.S. PATENT DOCUMENTS 5,229,640 A * 7/1993 Pak ..................... 257/666
5,321,299 A   6/1994 Ohkawa et al.
6,257,215 B1 * 7/2001 Kaminaga et al. ........ 123/647
6,344,973 B1   2/2002 Feustel et al.

FOREIGN PATENT DOCUMENTS

| DE | 39 41 814   | 6/1991  |            |
|----|-------------|---------|------------|
| DE | 197 00 963  | 7/1998  |            |
| DE | 298 19 349  | 12/1999 |            |
| JP | 11-18429    | 5/1989  |            |
| JP | 4-273150    | 9/1992  |            |
| JP | 9-102580    | 4/1997  |            |
| JP | 09-102580   | * 4/1997 | ......... 25/7 |
| JP | 09102580    | * 4/1997 | ......... 25/7 |
| JP | 10-304680   | 11/1998 |            |
| JP | 11-018429   | * 1/1999 | ......... 7/4 |
| JP | 11-289036   | 10/1999 |            |

* cited by examiner

Primary Examiner—Nathan J. Flynn
Assistant Examiner—Victor A. Mandala, Jr.
(74) Attorney, Agent, or Firm—Leydig, Voit & Mayer, Ltd.

(57) ABSTRACT

A power module incorporates a switching semiconductor element and a smoothing capacitor and includes a metallic base plate dissipating heat produced by the switching semiconductor element and the smoothing capacitor. The metallic base plate is thermally separated into a first region adjacent to the switching semiconductor element and a second region adjacent to the smoothing capacitor.

6 Claims, 5 Drawing Sheets

POWER MODULE

TECHNICAL FIELD

The present invention generally relates to power modules, each of which incorporates a switching semiconductor element (referred to as a "switching element", hereinafter), and a smoothing capacitor and including a metallic base plate capable of dissipating heat produced by the switching element and the smoothing capacitor and, more particularly, to a compact and lightweight power module of this type. The power module of the present invention is especially suitable for use in transportation means such as a vehicle.

BACKGROUND ART

FIG. 7 shows a conventional system of a power module 16 in which switching elements, etc. are accommodated. The power module 16 and smoothing capacitors 8 are connected by a parallel conductor 17 such that temperature changes of the smoothing capacitors 8 are restrained. However, in this conventional system of the power module 16, since an electrolytic capacitor is used as the smoothing capacitor 8, the conventional system becomes large in size as a whole. Meanwhile, since inductance between the smoothing capacitors 8 and the power module 16 is large, the switching elements should have high voltage-withstand performance so as to prevent destruction of the switching elements due to surge voltage caused by switching, so that the conventional system becomes large in size and has poor efficiency.

Meanwhile, FIGS. 8A and 8B show a circuit configuration and a mounting state of a semiconductor power converter disclosed in Japanese Patent Laid-Open Publication No. 10-304680 (1998), respectively. In this conventional semiconductor power converter, since a smoothing capacitor C is made compact by using as the smoothing capacitor C a ceramic capacitor having an internal resistance smaller than that of an electrolytic capacitor, both the smoothing capacitor C and switching elements Q1 to Q6 are mounted on a switching element substrate 36 so as to be commonly cooled by a cooling member 28, so that inductance between the smoothing capacitor C and the switching elements Q1 to Q6 can be reduced. However, in case water cooling, for example, is employed in the cooling member 28, the temperature of cooling water varies according to conditions of ambient environment and varies greatly, especially upon change in ambient temperature due to heat release of the switching elements Q1 to Q6. Meanwhile, the ceramic capacitor acting as the smoothing capacitor C has a temperature dependence in electrostatic capacitance and its electrostatic capacity decreases especially at high temperatures. It is necessary for the ceramic capacitor to secure a large electrostatic capacitance at high temperatures, so that the ceramic capacitor, and therefore, the conventional semiconductor power converter becomes large in size as a whole. Furthermore, since production cost of the ceramic capacitor per electrostatic capacitance is quite high, production cost of the ceramic capacitor having a large electrostatic capacitance becomes extremely high. In addition, the ceramic capacitor may experience sudden changes of its characteristics due to a phase transition at not less than a specific temperature according to its materials.

On the other hand, Japanese Patent Laid-Open Publication No. 11-289036 (1999) discloses an electronic device in which an exothermic element and a substrate for an electronic component are mounted on a base plate and a groove is formed, between the exothermic element and the substrate for the electronic component, on the base plate so as to thermally separate the base plate into a region adjacent to the exothermic element and a further region adjacent to the electronic component. Meanwhile, Japanese Patent Laid-Open Publication No. 4-273150 (1992) discloses a semiconductor device in which a base plate is split apart into a base plate section for an exothermic element and a further base plate section for an electronic component and the base plate section for the exothermic element and the further base plate section for the electronic component are disposed in contact with each other. However, these two known devices are arranged to lessen heat transfer from the exothermic element to the electronic component and therefore, do not aim at solving the problems of the conventional arrangements of FIG. 7 and FIGS. 8A and 8B, in which heat is transferred to the smoothing capacitor from an exothermic element acting as the switching element.

DISCLOSURE OF INVENTION

The present invention has for its object to provide a compact and light power module in which inductance between a switching element and a smoothing capacitor is reduced and changes of characteristics of the smoothing capacitor are lessened by restraining temperature changes of the smoothing capacitor.

In order to accomplish this object of the present invention, a power module according to the present invention incorporates a switching element and a smoothing capacitor and includes a metallic base plate capable of dissipating heat produced by the switching element and the smoothing capacitor such that the metallic base plate is thermally separated into a first region adjacent to the switching element and a second region adjacent to the smoothing capacitor.

Meanwhile, in the present invention, the metallic base plate is split apart into a first metallic base plate adjacent to the switching element and a second metallic base plate adjacent to the smoothing capacitor and the first and second metallic base plates are disposed so as to be spaced away from each other.

Furthermore, in the present invention, a relay insulating substrate is further provided between the switching element and the smoothing capacitor such that the switching element and the smoothing capacitor are connected to each other through the relay insulating substrate.

BEST MODE FOR CARRYING OUT THE INVENTION

Hereinafter, embodiments of the present invention are described with reference to the drawings.

(First Embodiment)

Figure 1:
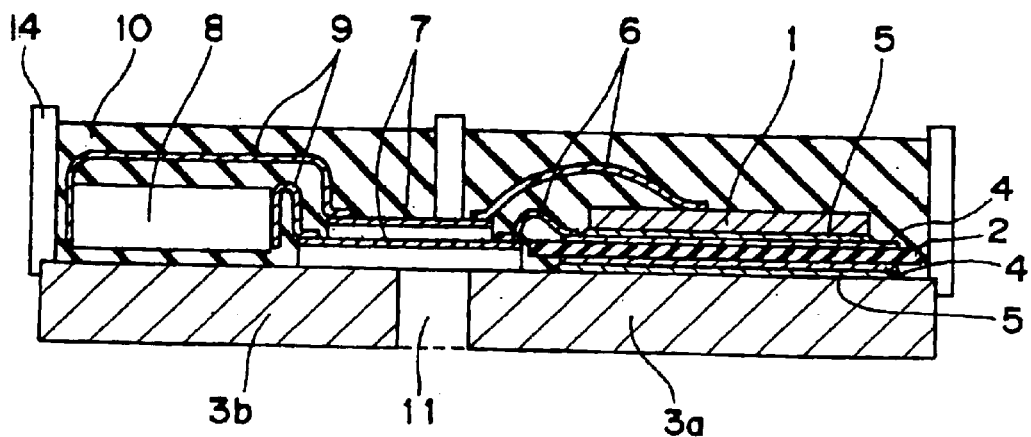
FIG. 1 is a fragmentary sectional view of a power module acting as a semiconductor power converter, according to a first embodiment of the present invention.
Figure 2:
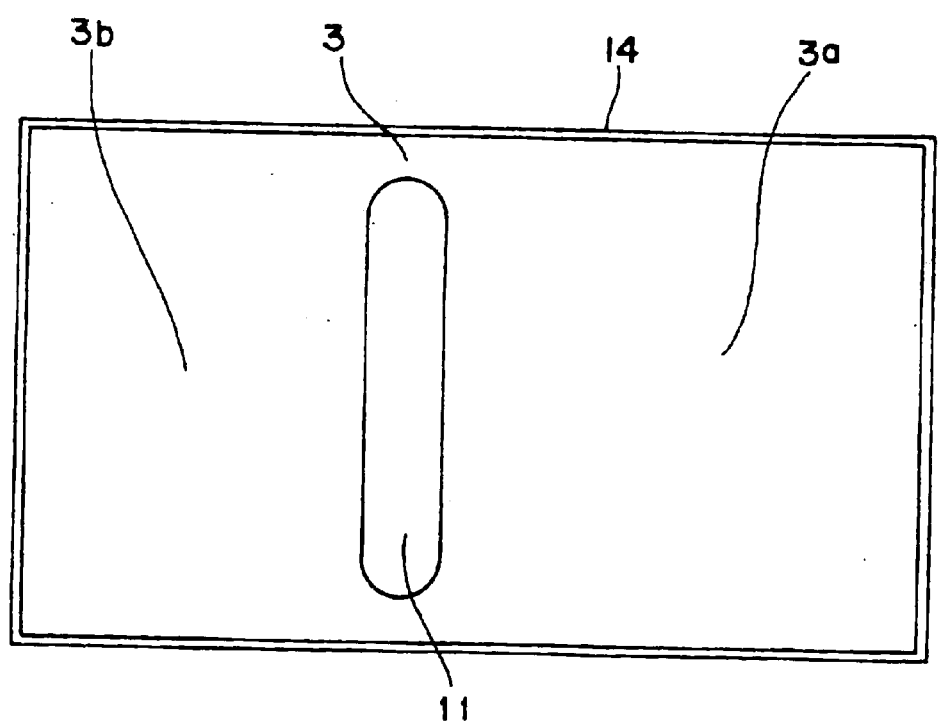
FIG. 2 is a fragmentary bottom plan view of the power module of FIG. 1.
Figure 3:
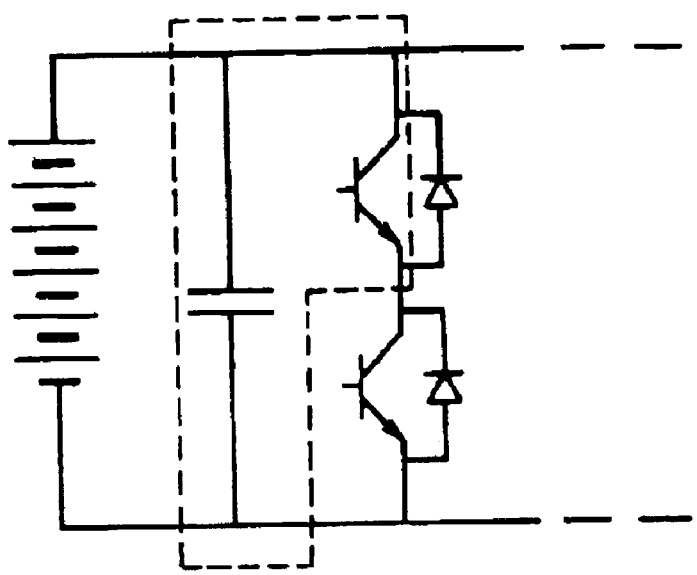
FIG. 3 is a circuit diagram of the power module of FIG. 1.

FIGS. 1 and 2 illustrate a portion of a power module according to a first embodiment of the present invention and this power module acts as a semiconductor power converter. FIG. 3 shows a circuit of this power module. The portion of the power module, which is illustrated in FIGS. 1 and 2, occupies a circuit portion enclosed by dotted lines in FIG. 3.

As shown in FIG. 1, this power module incorporates a switching element 1 and a smoothing capacitor 8 and is capable of dissipating, via a heat sink 3 acting as a cooling means, heat produced by the switching element 1 and the smoothing capacitor 8. A slit 11 is formed on the heat sink 3 so as to thermally separate the heat sink 3 into a first region 3a adjacent to the switching element 1 and a second region 3b adjacent to the smoothing capacitor 8. As shown in FIG. 2, the first and second regions 3a and 3b of the heat sink 3 are connected to each other outside opposite ends of the slit 11. The switching element 1 is secured to an upper surface electrode 4 of an insulating metallized substrate 2 by, for example, solder 5, while a lower surface electrode 4 of the insulating metallized substrate 2 is secured to the first region 3a of the heat sink 3 by, for example, the solder 5.

Aluminum wires 6 connect the switching element 1 and the upper surface electrode 4 of the insulating metallized substrate 2 to conductors 7 incorporated partially in a casing 14. The smoothing capacitor 8 is disposed adjacent to the second region 3b of the heat sink 3 and connective conductors 9 of the smoothing capacitor 8 connect the smoothing capacitor 8 and the conductors 7. For example, electrical insulating filler 10 having high thermal conductivity defines a heat conduction path for guiding heat of the smoothing capacitor 8 to the second region 3b of the heat sink 3.

When heat release value from the switching element 1 increases in response to variations of load, temperature of the first region 3a of the heat sink 3 adjacent to the switching element 1 rises. However, the first and second regions 3a and 3b of the heat sink 3 adjacent to the switching element 1 and the smoothing capacitor 8, respectively are thermally separated from each other by the slit 11 as described above. Therefore, even if temperature of the first region 3a of the heat sink 3 adjacent to the switching element 1 rises, temperature rise of the second region 3b of the heat sink 3 adjacent to the smoothing capacitor 8 is small and thus, temperature rise of the smoothing capacitor 8 is restrained.

Hence, since temperature rise of the smoothing capacitor 8 can be restrained regardless of load conditions of the power module, it is possible to eliminate undesirable reduction of electrostatic capacity of the smoothing capacitor 8 resulting from temperature characteristics of the smoothing capacitor 8 and disadvantageous phase transition of the smoothing capacitor 8 resulting from temperature dependence of the smoothing capacitor 8. Therefore, by setting the smoothing capacitor 8 to a smaller electrostatic capacity against that required for the semiconductor power converter, the smoothing capacitor 8 is capable of continuing to operate stably. Meanwhile, since a distance between the smoothing capacitor 8 and the switching element 1 is restricted to be small, inductance between the smoothing capacitor 8 and the switching element 1 is small. Accordingly, since it is not necessary to secure an excessively large voltage-withstand distance for the switching element 1, a width of an insulating guard ring of the switching element 1 is not required to be made large excessively and a creeping insulating distance of the insulating metallized substrate 2 is not required to be made large excessively, so that the power module can be made compact as a whole.

Consequently, in accordance with the first embodiment of the present invention, the power module can be made compact and light as a whole.

Meanwhile, in this embodiment, the heat sink 3 is used as the cooling means but may be replaced by any other member for cooling the switching element 1 and the smoothing capacitor 8 through heat conduction, for example, a water cooling fin.

Meanwhile, in this embodiment, the slit 11 is formed on the heat sink 3. However, for example, if a member having a small coefficient of thermal conductivity is embedded between a switching element portion and a smoothing capacitor portion of the heat sink 3 so as to thermally separate the switching element portion and the smoothing capacitor portion of the heat sink 3 from each other, an effect identical with that of the slit 11 can be gained. In this case, supposing that thermal resistance between the switching element portion and the smoothing capacitor portion of the heat sink 3 is 0.05 K/W, temperature difference between the switching element portion and the smoothing capacitor portion of the heat sink 3 is as large as 150° C. even if a heat of 3 KW is produced at the switching element portion of the heat sink 3. On the other hand, since the switching element 1 is usually designed thermally so as not to exceed 150° C., the switching element portion and the smoothing capacitor portion of the heat sink 3 are thermally separated from each other sufficiently.

(Second Embodiment)

Figure 4:
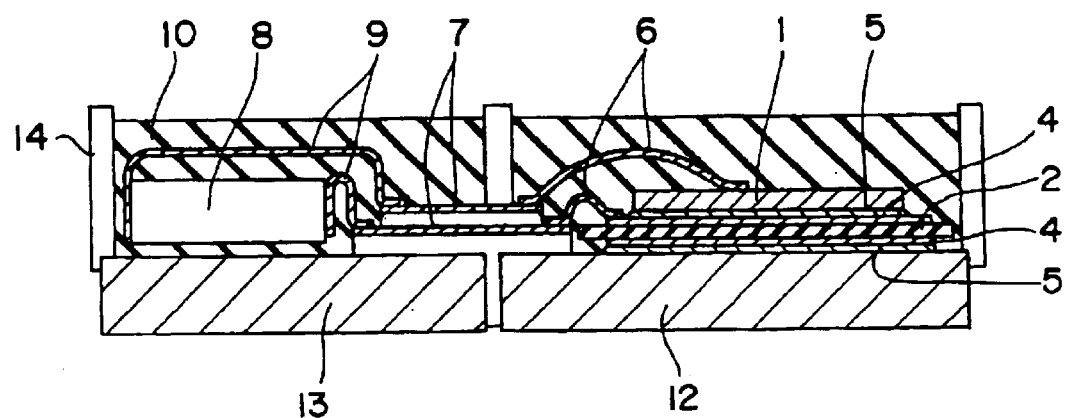
FIG. 4 is a fragmentary sectional view of a power module acting as a semiconductor power converter, according to a second embodiment of the present invention.
Figure 5:
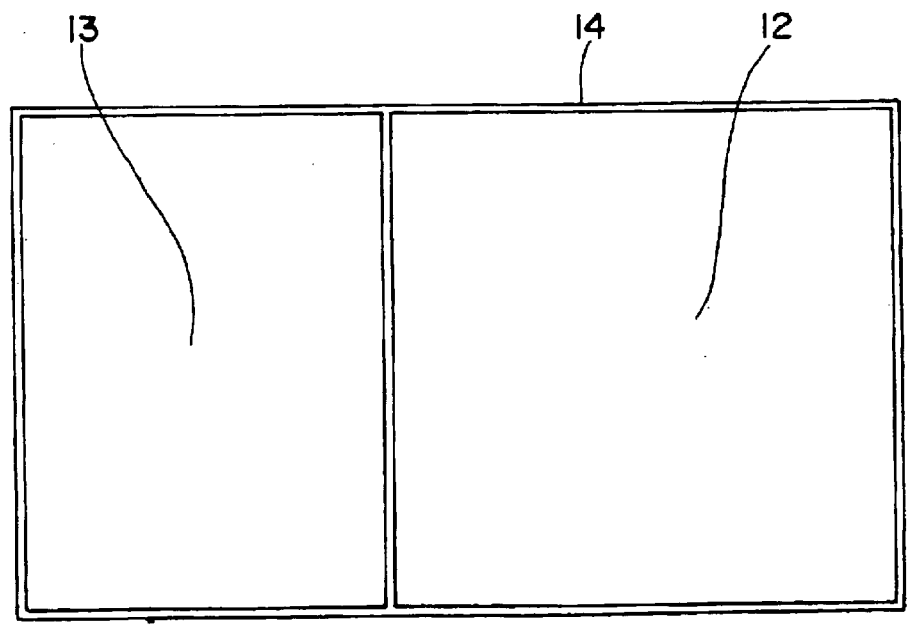
FIG. 5 is a fragmentary bottom plan view of the power module of FIG. 4.

FIGS. 4 and 5 illustrate a portion of a power module according to a second embodiment of the present invention and this power module acts as a semiconductor power converter. In this embodiment, a heat sink is split apart into a first heat sink 12 adjacent to the switching element 1 and a second heat sink 13 adjacent to the smoothing capacitor 8 and the first and second heat sinks 12 and 13 are disposed so as to be spaced away from each other as shown in FIG. 5. The lower surface electrode 4 of the insulating metallized substrate 2 to which the switching element 1 is fixed is secured to the first heat sink 12 by, for example, the solder 5, while the smoothing capacitor 8 is disposed adjacent to the second heat sink 13. The filler 10 defines a heat conduction path for guiding heat of the smoothing capacitor 8 to the second heat sink 13. Since other constructions of the power module according to the second embodiment of the present invention are similar to those of the power module according to the first embodiment of the present invention, the description is abbreviated for the sake of brevity.

When heat release value from the switching element 1 increases in response to variations of load, temperature of the first heat sink 12 adjacent to the switching element 1 rises. However, since the heat sink is split apart into the first heat sink 12 adjacent to the switching element 1 and the second heat sink 13 adjacent to the smoothing capacitor 8 and the first and second heat sinks 12 and 13 are disposed so as to be spaced away from each other as described above, the first and second heat sinks 12 and 13 are thermally separated from each other positively. Therefore, even if temperature of the first heat sink 12 adjacent to the switching element 1 rises, temperature rise of the second heat sink 13 adjacent to the smoothing capacitor 8 is extremely small and thus, temperature rise of the smoothing capacitor 8 is restrained more greatly than that of the first embodiment.

Consequently, in accordance with the second embodiment of the present invention, the power module can be made more compact and lighter as a whole than the first embodiment.

(Third Embodiment)

Figure 6:
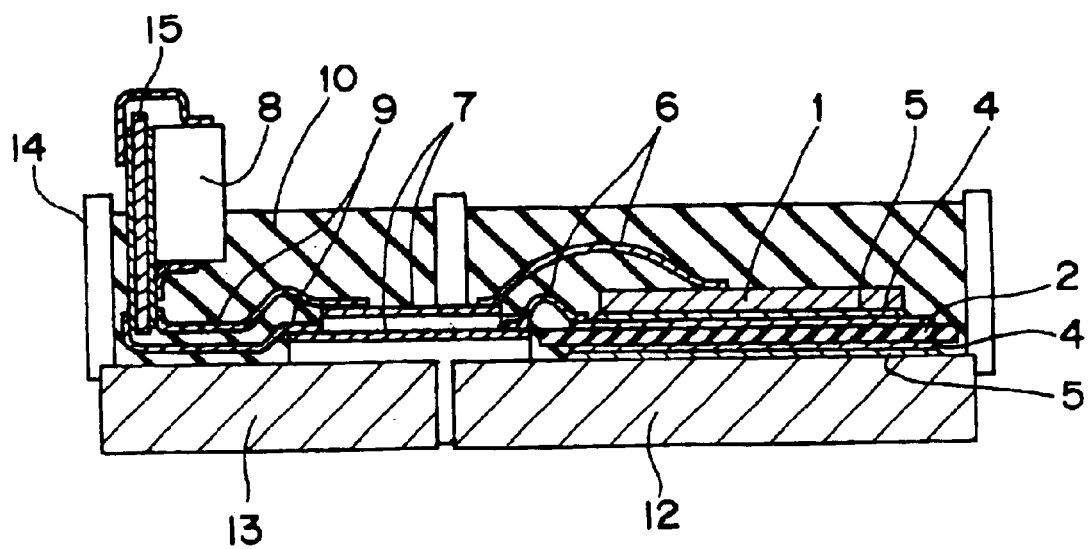
FIG. 6 is a fragmentary sectional view of a power module acting as a semiconductor power converter, according to a third embodiment of the present invention.
Figure 7:
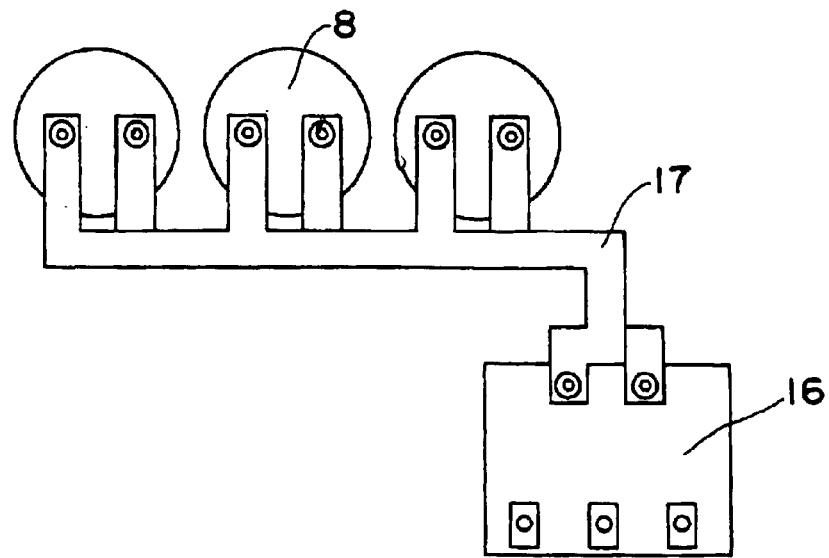
FIG. 7 is a top plan view of a prior art system of a power module.
Figure 8A:
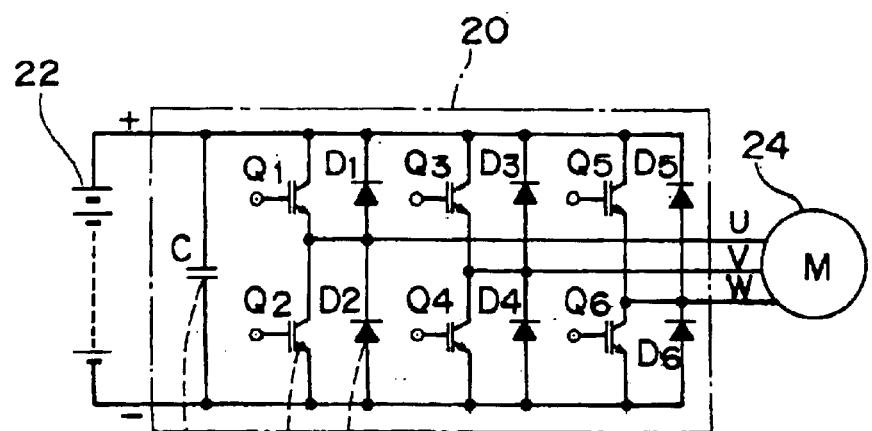
FIGS. 8A and 8B are views showing a circuit configuration and a mounting state of a prior art semiconductor power converter, respectively.
Figure 8B:
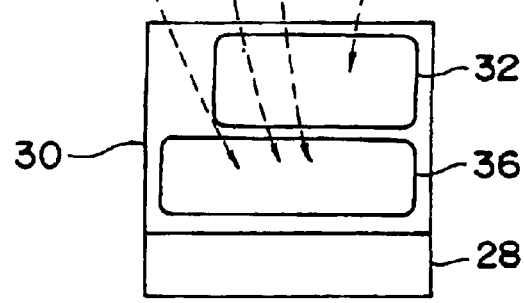

FIG. 6 illustrates a portion of a power module according to a third embodiment of the present invention and this power module acts as a semiconductor power converter. In this embodiment, the smoothing capacitor 8 is fixed to a support plate 15 and the support plate 15 is disposed adjacent to the second heat sink 13. The support plate 15 conducts heat of the smoothing capacitor 8 to the second heat sink 13 via a heat conduction path (not shown) so as to restrain temperature rise of the smoothing capacitor 8. Since other constructions of the power module according to the third embodiment of the present invention are similar to those of the power module according to the second embodiment of the present invention, the description is abbreviated for the sake of brevity.

By fixing the smoothing capacitor 8 to the support plate 15 as described above, long-term reliability of the smoothing capacitor 8 can be further improved in case the smoothing capacity 8 is made of material having a coefficient of thermal expansion quite different from that of the heat sink. Meanwhile, since dielectric strength distance between the heat sink and the connective conductors 9 can be made long, the power module of this embodiment is suitable for high-voltage applications.

The above described third embodiment is applied to the second embodiment in which the heat sink is split apart into the first heat sink 12 and the second heat sink 13 but may also be applied, needless to say, to the first embodiment in which the heat sink 3 is thermally separated into the first region 3a and the second region 3b by the slit 11.

As is clear from the foregoing description of the present invention, since not only inductance between the switching element and the smoothing capacitor is reduced but the switching element and the smoothing capacitor are disposed such that heat of the switching element and heat of the smoothing capacitor are, respectively, conducted to the two thermally separated portions of the heat sink, the switching element does not need to have excessively high voltage-withstand performance to withstand surge voltage caused by switching and changes of characteristics of the smoothing capacitor due to temperature changes of the smoothing capacitor are restrained, so that such a remarkable effect is achieved that the power module can be made compact and light.

What is claimed is:

1. A power module including:
   a switching semiconductor element;
   a smoothing capacitor; and
   a metallic base plate dissipating heat produced by the switching semiconductor element and the smoothing capacitor, wherein
   the metallic base plate is thermally divided into a first region, adjacent to the switching semiconductor element, and a second region, adjacent to the smoothing capacitor, by an opening entirely within the base plate and extending through the metallic base plate,
   the opening has opposed ends, and
   the first and second regions are connected to each other at and beyond the opposite ends of the opening.

2. The power module according to claim 1 wherein the smoothing capacitor is an electrolytic capacitor.

3. The power module according to claim 1, wherein the switching semiconductor element, the smoothing capacitor, and a first surface of the metallic base plate are at a least partially covered by an insulating material, and a second surface of the metallic base plate is exposed and not covered with an insulating material.

4. A power module including:
   a first metallic base plate for dissipating heat;
   a switching semiconductor element mounted on the first metallic base plate;
   a second metallic base plate for dissipating heat; and
   a smoothing capacitor fixed to the second metallic base plate, wherein the first and second metallic base plates are spaced apart from each other and are not continuous with each other.

5. The power module according to claim 4 wherein the smoothing capacitor is an electrolytic capacitor.

6. The power module according to claim 4, wherein the switching semiconductor element, the smoothing capacitor, a first surface of the first metallic base plate, and a first surface of the second metallic base plate are at a least partially covered by an insulating material, and a second surface of the first metallic base plate and a second surface of the second metallic base plate are exposed and not covered with an insulating material.

* * * * *